United States Patent
Bringoltz et al.

(10) Patent No.: US 9,851,300 B1
(45) Date of Patent: Dec. 26, 2017

(54) DECREASING INACCURACY DUE TO NON-PERIODIC EFFECTS ON SCATTEROMETRIC SIGNALS

(71) Applicant: KLA-Tencor Corporation, Milpitas, CA (US)

(72) Inventors: Barak Bringoltz, Rishon LeTzion (IL); Ofer Zaharan, Jerusalem (IL); Amnon Manassen, Haifa (IL); Nadav Carmel, Mevasseret-Zion (IL); Victoria Naipak, Barak (IL); Alexander Svizher, Haifa (IL); Tzahi Grunzweig, Timrat (IL); Daniel Kandel, Aseret (IL)

(73) Assignee: KLA-Tencor Corporation, Milpitas, CA (US)

(*) Notice: Subject to any disclaimer, the term of this patent is extended or adjusted under 35 U.S.C. 154(b) by 0 days.

(21) Appl. No.: 14/678,411

(22) Filed: Apr. 3, 2015

Related U.S. Application Data

(60) Provisional application No. 61/975,653, filed on Apr. 4, 2014.

(51) Int. Cl.
*G01N 21/55* (2014.01)

(52) U.S. Cl.
CPC ... *G01N 21/55* (2013.01); *G01N 2201/06113* (2013.01)

(58) Field of Classification Search
CPC ........... G01N 21/956; G01N 2021/213; G01N 21/9501; G01N 2021/8416; G01N 21/211; G01N 21/47; G01N 21/4785; G01N 21/95607; G01B 11/27
See application file for complete search history.

(56) References Cited

U.S. PATENT DOCUMENTS

| | | | |
|---|---|---|---|
| 9,518,916 B1* | 12/2016 | Pandev | G01N 21/255 |
| 2004/0169861 A1* | 9/2004 | Mieher | G01N 21/956 356/400 |
| 2004/0190008 A1* | 9/2004 | Mieher | G01N 21/956 356/625 |
| 2012/0033215 A1* | 2/2012 | Kandel | G03F 7/70683 356/366 |
| 2016/0178351 A1* | 6/2016 | Amit | G01N 21/9501 356/243.1 |

FOREIGN PATENT DOCUMENTS

WO 2014004564 A1 1/2014

* cited by examiner

*Primary Examiner* — Michael P Stafira
(74) *Attorney, Agent, or Firm* — Suiter Swantz pc llo

(57) ABSTRACT

Methods and metrology modules and tools are provided, which minimize an estimated overlay variation measure at misalignment vector values obtained from a derived functional form of an overlay linear response to non-periodic effects. Provided methods further quantifying target noise due to the non-periodic effects using multiple repeated overlay measurements of the target cells, calculating an ensemble of overlay measurements between the cells over the multiple measurement repeats and expressing the target noise as a statistical derivative of the calculated overlay measurements. Sub-ensembles may be selected to further characterize the target noise. Various outputs include optimized scanning patterns, target noise metrics and recipe and target optimization.

20 Claims, 8 Drawing Sheets

_100_

150 — MINIMIZING AN ESTIMATED OVL3S AT MISALIGNMENT VECTOR VALUES OBTAINED FROM A DERIVED FUNCTIONAL FORM OF THE OVERLAY LINEAR RESPONSE TO NON-PERIODIC EFFECTS

160 — CORRECTING MISALIGNMENT ERRORS (E.G., ON THE FLY) USING DERIVED DEPENDENCIES OF OVL3S AND OF OVL($\vec{d}$) IN A PRE-PRODUCTION CALIBRATION STAGE 170 — SELECTING A SAMPLE PLAN FOR MOVEMENTS BETWEEN TARGETS TO MINIMIZE MISALIGNMENT ERRORS 180 — SELECTING A SPOT SIZE TO BE LARGER THAN A DETERMINED TARGET NOISE SCALE TO MINIMIZE INACCURACY

182 — DERIVING A DEPENDENCY OF THE OVL3S AND OVL ON THE ILLUMINATION SPOT SIZE

184 — DETERMINING A LENGTH SCALE OF THE MAJOR CONTRIBUTOR OF THE TARGET NOISE

190 — MINIMIZING INACCURACY BY SELECTING PIXEL WEIGHTS TO BE A DECREASING FUNCTION OF THEIR SPOT SCAN SENSITIVITY

Figure 3

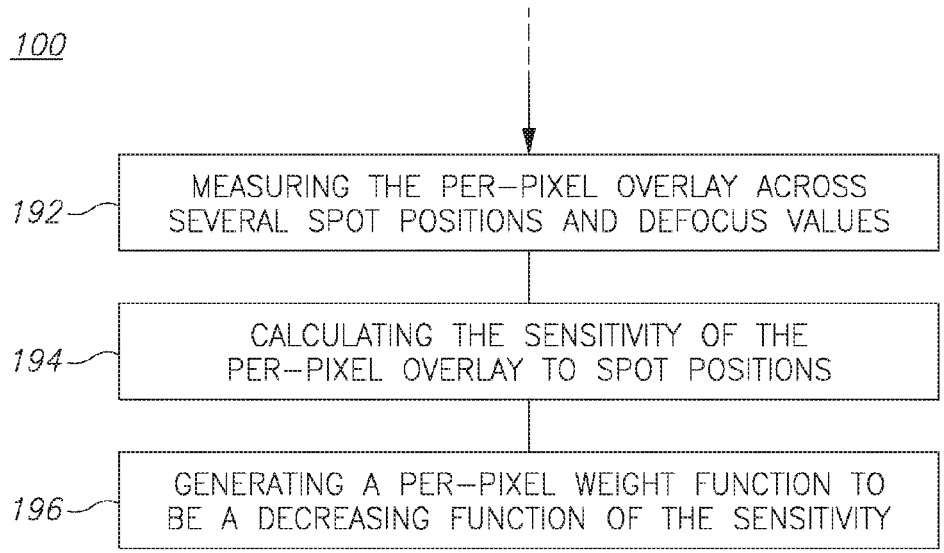
Figure 3 (cont. 1)
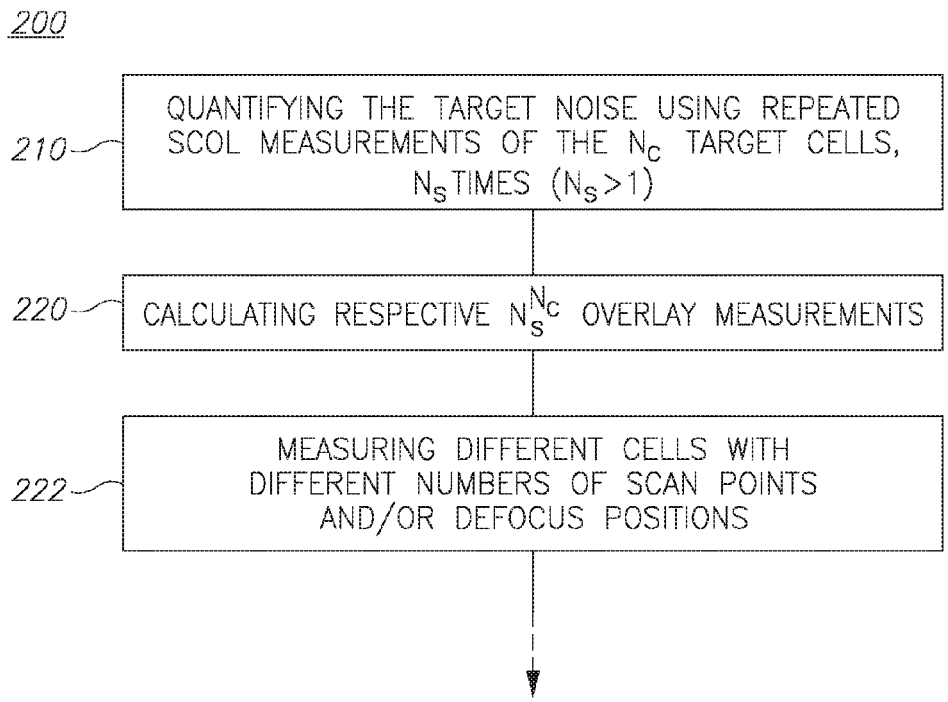
Figure 4

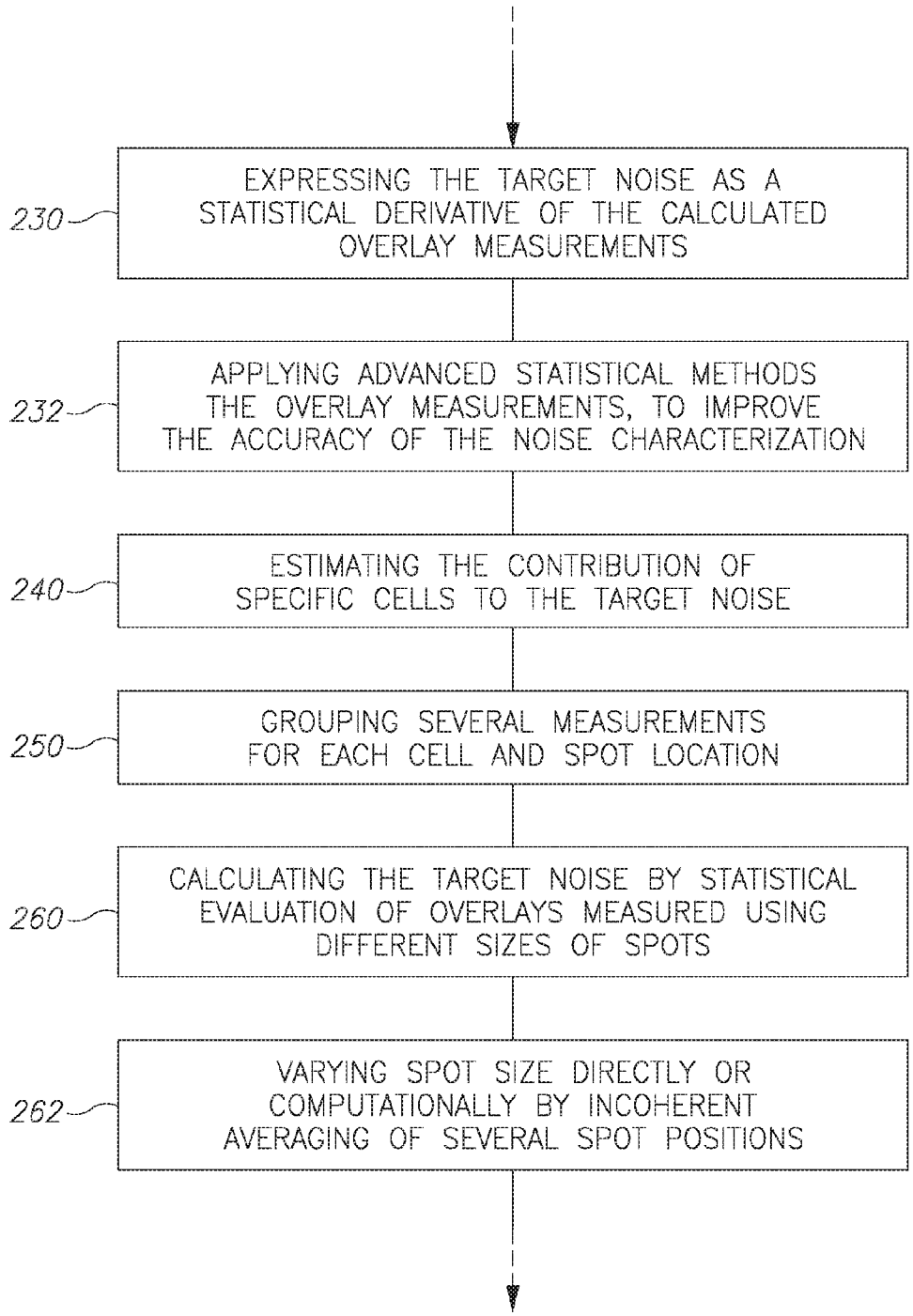
Figure 4 (cont. 1)

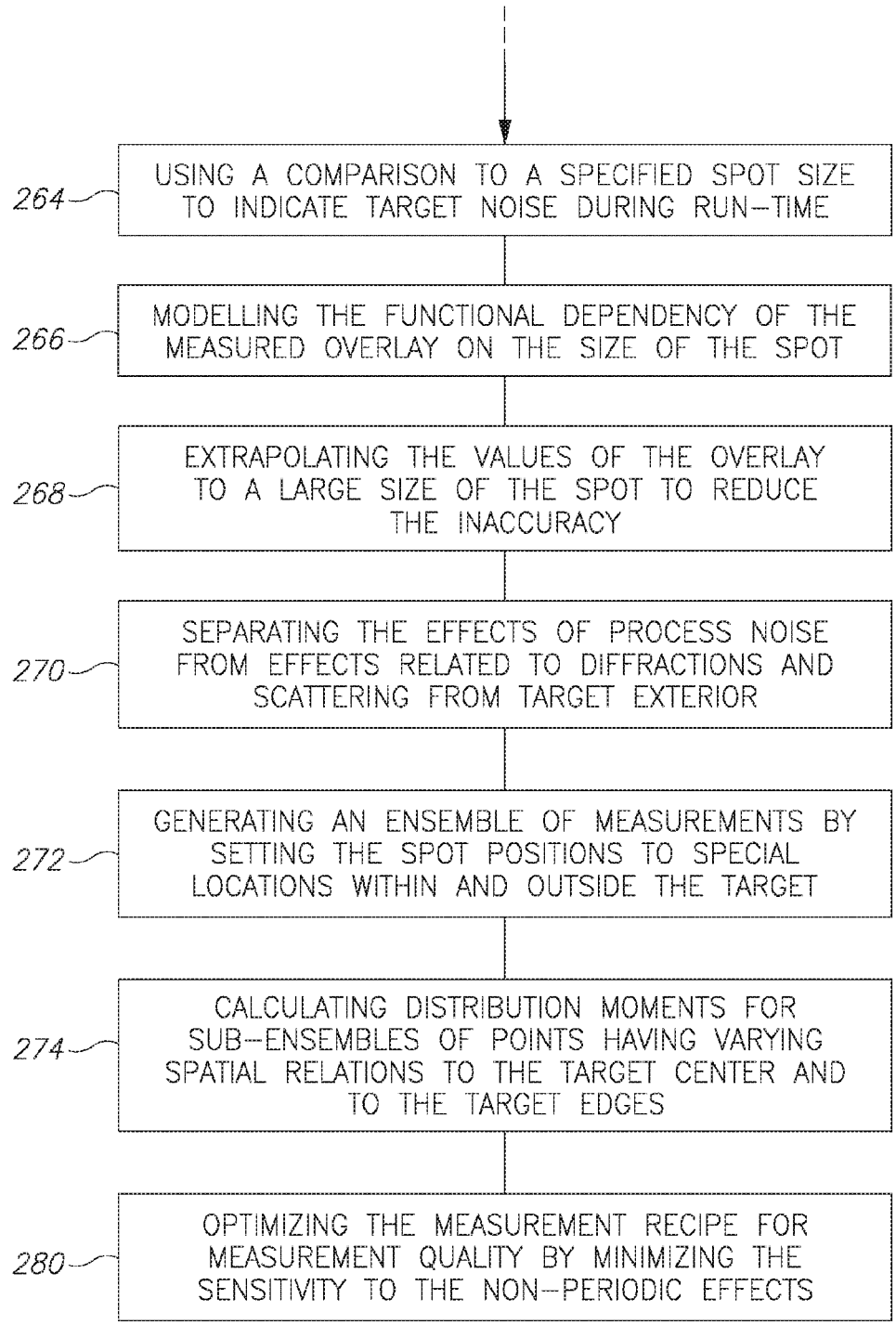
Figure 4 (cont. 2)

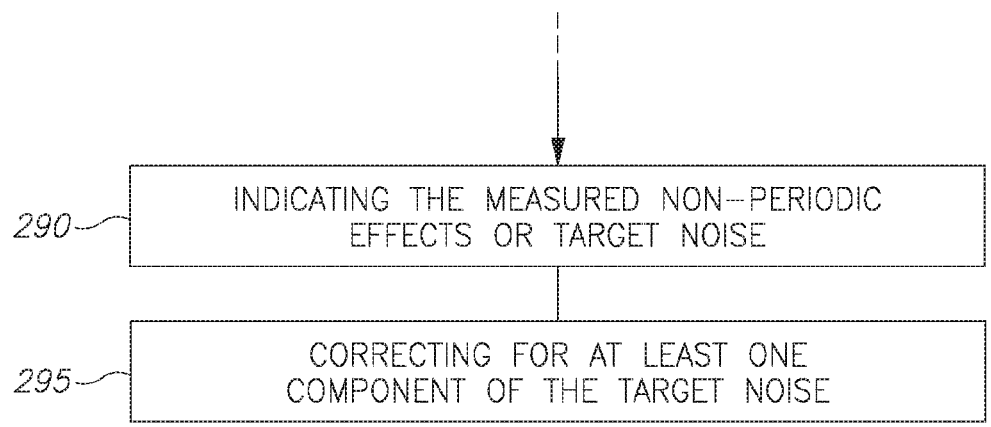
Figure 4 (cont. 3)

DECREASING INACCURACY DUE TO NON-PERIODIC EFFECTS ON SCATTEROMETRIC SIGNALS

CROSS-REFERENCE TO RELATED APPLICATIONS

This application claims the benefit of U.S. Provisional Patent Application No. 61/975,653, filed on Apr. 4, 2014, which application is incorporated herein by reference in its entirety.

TECHNICAL FIELD

The present invention relates to the field of metrology, and more particularly, to accuracy enhancement in scatterometry measurements.

BACKGROUND

Overlay measurement technologies, especially scatterometry, require that the cells which make up the target (e.g., SCOL (scatterometry overlay) targets), are all perfectly periodic with the same pitch. Any breakdown of this requirement involves a degradation of accuracy and TMU (total measurement uncertainty). Specifically, if the breakdown of periodicity is such that a position on the SCOL cell exists, which generates a pupil signal consisting of a symmetry breaking that is only due to the SCOL cell's offset, then only at that special position the SCOL inaccuracy is zero. Obviously it is not guaranteed that this 'special' position exists in any useful sense (i.e., that the position is known and that it is surrounded by regions which are large enough to enable locating the position in spite positioning errors).

Furthermore, any misalignment of the illumination system from that special position causes further inaccuracy, due to the following physical process explanation. First, considering as an illustrative example a perfectly periodic target of a typical pitch P=600 nm which is illuminated by a monochromatic light of wavelength 400 nm, the only diffraction orders which enter the collection pupil plane are the −1st, the 0th, and the +1st diffraction orders. Also, these orders are completely separated in pupil space and their edges are infinitely sharp. If the spot now moves across the target, each order carries its own pupil phase (which is proportional to the spot movement parameter, x, to the diffraction order index, n, and inversely proportional to the target pitch). As the pupil detector (e.g., a CCD) measures intensity, this phase information is washed out and no knowledge about the spot movement is carried in the pupil SCOL signals, which means that the measured overlay is perfectly independent from the spot position (as it should be on a perfectly periodic SCOL target). Similarly in the case of metrology tool defocus, the defocus-related phases are washed out.

Typically, approaches to measuring targets which are not perfectly periodic can be divided into two approaches. A first approach is disclosed by WIPO Patent Publication No. 2014004564 which includes averaging over a variety of spot positions to average out the interference terms. A second approach is to select target and measurement designs in which the breakdown of periodicity, as sensed by the metrology tool, is small. Examples for such designs include increasing target size, modifying the process flow, picking illumination conditions like wavelength and polarization that are insensitive to the target noise. However, these methods have various shortcomings. The first method assumes that the length scale of the target noise is either very much smaller than the averaging length scale or very much larger; an assumption which may not hold in reality. Importantly, the quantitative knowledge of the length scale may be absent. Also, the averaging length scale is bounded from above by the SCOL cell's size thereby forming an upper bound to the effectiveness of the averaging. The success of the second method is predicated on the assumption that the sought combination of an optimal target design and illumination conditions indeed exists. Besides, it burdens the metrology tool design, which, to allow flexibility in illumination conditions, must be very diverse (e.g., contain many possible wavelengths).

SUMMARY OF THE INVENTION

The present invention comprises an angle-resolved reflectometer having a coherent light source, an optical system arranged to scan a target pattern using a spot of coherent light from the light source to yield a plurality of realizations of a light distribution in a collected pupil, wherein the spot covers a part of the target pattern and the scanning is carried out according to a scanning pattern, and a processing unit arranged to minimize an estimated overlay variation measure at misalignment vector values obtained from a derived functional form of an overlay linear response to non-periodic effects, select the scanning pattern to minimize misalignment errors according to the derived functional form of an overlay linear response to non-periodic effects, and generate a composite image of the collected pupil distribution by combining the plurality of realizations of the light distribution in the collected pupil.

The present invention also comprises a computer-based apparatus, having a memory element configured to store a plurality of computer-readable instructions, a processor configured to execute the plurality of computer-readable instructions to minimize an estimated overlay variation measure at misalignment vector values obtained from a derived functional form of an overlay linear response to non-periodic effects, at least partly carried out by at least one computer processor.

The present invention also comprises a method, having minimizing an estimated overlay variation measure at misalignment vector values obtained from a derived functional form of an overlay linear response to non-periodic effects, at least partly carried out by at least one computer processor.

One aspect of the present invention provides a method of minimizing an estimated overlay variation measure at misalignment vector values obtained from a derived functional form of an overlay linear response to non-periodic effects.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like reference characters designate corresponding elements or sections throughout.

In the accompanying drawings:

FIG. 3 is a high level schematic flowchart of a method of increasing the accuracy of overlay measurements, according to an exemplary embodiment of the present invention;

FIG. 4 is a high level schematic flowchart of a method of measuring nonperiodic effects in overlay measurements, according to an exemplary embodiment of the invention.

DETAILED DESCRIPTION OF THE INVENTION

Figure 1A:
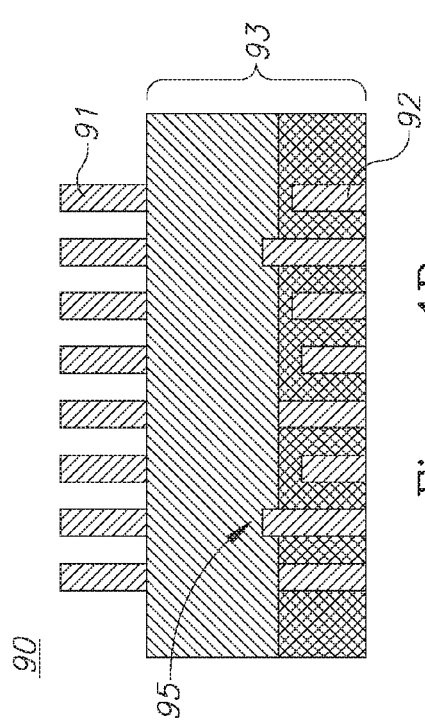
FIG. 1A is a high level schematic illustration of an exemplary non-periodic effects, according to an embodiment of the present invention.
Figure 1B:
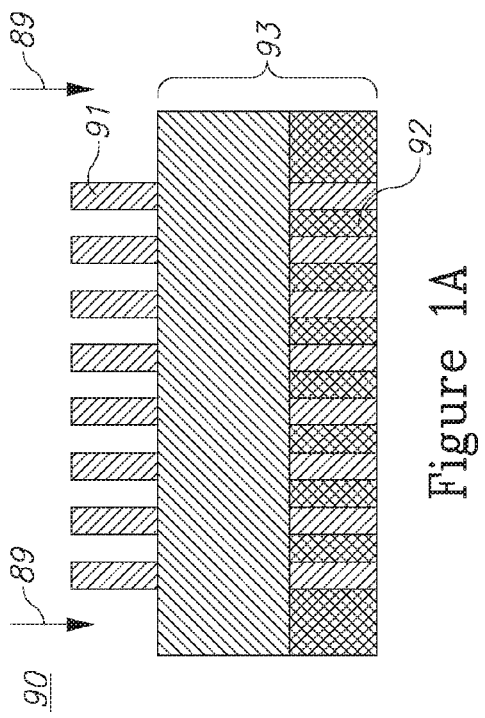
FIG. 1B is a high level schematic illustration of an exemplary non-periodic effects, according to an embodiment of the present invention.
Figure 1C:
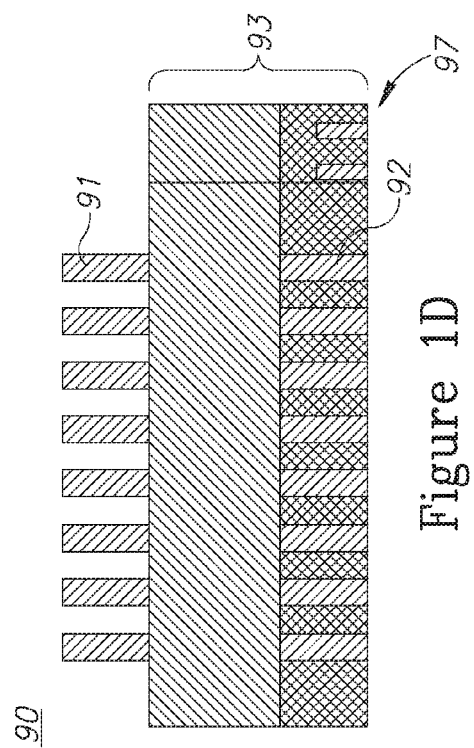
FIG. 1C is a high level schematic illustration of an exemplary non-periodic effects, according to an embodiment of the present invention.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

The terms "non-periodic structure" or "non-periodic target" as used in this application, as well as the terms "non-periodic effects", "periodicity breaking" and "target noise" as used in this application, refer to deviations of target structures from perfect periodicity, and comprise physical deviations of target structures from periodicity (e.g., pitch variation, differences in the dimensions of structural elements), effects of edges of target structures (rendering them inherently non-periodic), optical effects such as light diffraction and light scattering from the vicinity of the target structures or from their edges which reaches the detector, as well as phenomena which reflect length scales to the target which are different from the optical metrology pitch. Such length scales may arise, e.g., from induced topography wafer noise, line edge roughness, line-width roughness, and any other undesired process-related noise. It is noted that non-periodic effects, or target noise, may thus have random or semi-random components (e.g., process variations) as well as systematic, non-random components (e.g., effects of edge).

In contrast to ideal, perfectly periodic targets, if the target is not periodic (due to finite size effects and target noise), the diffraction orders are not well-defined in the collection pupil. In particular, if the breakdown of periodicity is a result of diffractions from objects of typical size L, then the diffraction orders are interleaved by diffraction patterns having a length scale that is given by the ratio of the wavelength and L (in NA units).

The pupil locations in which the diffraction patterns exist experience the interference of multiple diffraction orders, each carrying its own phase that depends on the spot wafer position and on the spot defocus. The interference terms contain information on such parameters and so the resulting overlay measurements at these spot parameters may strongly depend on spot positioning and defocus—resulting in degraded accuracy and TMU.

Figure 1D:
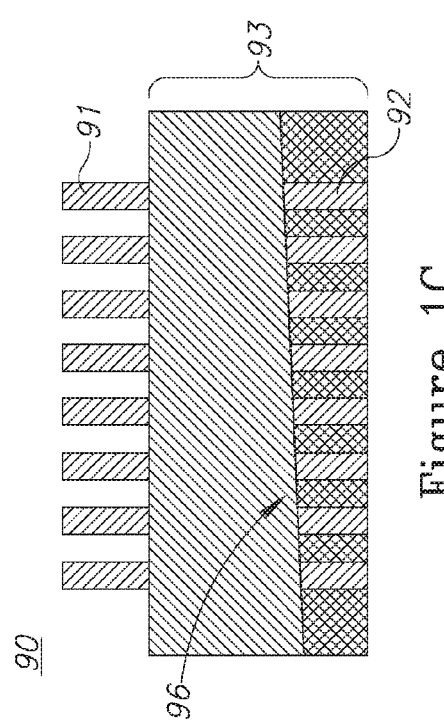
FIG. 1D is a high level schematic illustration of an exemplary non-periodic effects, according to an embodiment of the present invention.

FIGS. 1A-1D are high level schematic illustrations of exemplary non-periodic effects, according to some embodiments of the invention. As explained above, non-periodic effects or target noise may result from various structural, optical and process factors, some of which random and other systematic in nature. In the present disclosure, the influence of non-periodic effects on metrology measurement is related to collectively as target noise. Non-periodic effects illustrated in FIGS. 1A-1D comprise—referring to targets (or target cells) 90 comprising at least two periodic structures 91, 92 (e.g., having a single pitch) in a stack of layer 93—structure edge effects 89 (FIG. 1A), structure element variation 95, e.g., due to processes like CMP (chemical mechanical planarization) or etch which may introduce random variations to the processed layer 92 (FIG. 1B), non-random process effects 96, e.g., resulting in film thickness or grating profile variation having a specified dominant length scale which is different from the pitch (in case the dominant length scale equals the pitch, other effects may contribute to the noise), and optical influence of adjacent structures 97 (intended or unintended), e.g., diffraction from adjacent structures, edges or otherwise asymmetric vicinity of the target (FIG. 1D).

The inventors note that periodicity-breaking noise (resulting from the non-periodic effects) degrades not only SCOL (scatterometry overlay) accuracy, but also induces a sensitivity of the measurement to the position of the spot on the target (which determines how the illumination spot interacts with the noise). This, in turn, when coupled to the inevitably imperfect spot positioning system, also degrades the precision, tool-induced-shift (TIS), TIS3S, and tool matching parameters. The following introduces ways to decrease the inaccuracy related to target noise in scatterometry metrology, and in particular in SCOL.

The following presents methods that overcome the inaccuracy and TMU degradation discussed in the background. It is emphasized that the present invention is applicable to all type of scatterometric metrology technologies, including but not restricted to, technologies that rely on the intensities within $1^{st}$ order diffraction signals, within $0^{th}$ order diffraction, as well as for phase shift interferometry measurements like side by side technologies, CD measurements etc.

Methods and metrology modules and tools are provided, which minimize an estimated overlay variation measure at misalignment vector values obtained from a derived functional form of an overlay linear response to non-periodic effects. Provided methods further quantifying target noise due to the non-periodic effects using multiple repeated overlay measurements of the target cells, calculating an ensemble of overlay measurements between the cells over the multiple measurement repeats and expressing the target noise as a statistical derivative of the calculated overlay measurements. Sub-ensembles may be selected to further characterize the target noise. Various outputs include optimized scanning patterns, target noise metrics and recipe and target optimization.

The per-pupil pixel overlay measurement dependence on the misalignment error may be expressed as in Equation 1.

$$OVL(\vec{k},\vec{d}) = OVL_{real} + \vec{d} \cdot \vec{A}(\vec{k}) + O(d^2) \quad \text{Equation 1}$$

Here, the vector $\vec{d}$ is the 'misalignment vector', defined to be the difference between the position on which the SCOL cell is symmetric (in the absence of SCOL offset) and the actual position of the spot; in the case of defocus, it is the defocus itself. The vector $\vec{k}$ is the wave vector that corresponds to a certain pupil point, and the vector $\vec{A}$ is the overlay linear response to the misalignment. The above relation holds to leading order in the misalignment vector $\vec{d}$, as the remaining term $O(d^2)$ suggests. The inventors studied the dependency of $\vec{A}$ on the illumination conditions (e.g., wavelength, polarization, apodization, etc.), on the details of the wafer reflectivity, on the pupil point, and on the target design. For example, the inventors have shown that for a grating in the X direction, which measures the overlay in the X-direction, and which experiences target noise that is approximately invariant along the Y-axis, Equation 2 holds.

$$A_x \gg A_y. \quad \text{Equation 2}$$

Also, it was found that in case the overlay sensitivity reflects diffraction from the edges of the target or field stops, the size of A increases with the ratio of the zeroth to first order diffraction efficiency, and decreases with the size of the amplitude of the spot tail at the edge of the cell and/or field stop. In this case of diffraction effects, simulations show that the ratio between $A_x$ and $A_y$ can easily reach hundreds or thousands for an X-grating.

It is further noted that even prior to the linearity assumption leading to the term $\vec{d} \cdot \vec{A}(\vec{k})$ in Equation 1, Equation 1a holds, $$OVL(\vec{k},\vec{d}) = OVL_{real} + B(\vec{k},\vec{d}) \quad \text{Equation 1a}$$

with the function B being strongly dependent on the same factors, i.e., on the illumination conditions (e.g., wavelength, polarization, apodization, etc.), on the details of the wafer reflectivity, on the pupil point, and on the target design.

Using Equation 1 the inventors found that the weighted averaged of the per-pupil-pixel overlay fluctuations (3 sigma), denoted by OVL3S (3σ of the distribution of OVL values over the pupil pixels with respect to the average OVL), obeys Equation 3.

$$OVL3S(\vec{d}) = \sqrt{d_x^2 \widetilde{A_x^2} + d_y^2 \widetilde{A_y^2} + 2 d_x d_y \widetilde{A_x A_y}} \cong |d_x| \sqrt{\widetilde{A_x^2}} + \ldots \quad \text{Equation 3}$$

The tilde (~) signs over respective quantities denote the pupil average of that quantity, which may be (but is not necessarily) a weighted average. It is noted that evaluating the OVL3S does not require any prior knowledge on the overlay itself, and may be carried out on the fly and very quickly.

Certain embodiments comprise a number of techniques that are aimed to eliminate the misalignment sensitivity of the overlay measurement, and which utilize the derivation presented above. It is noted that these techniques may be combined or performed separately.

Figure 2:
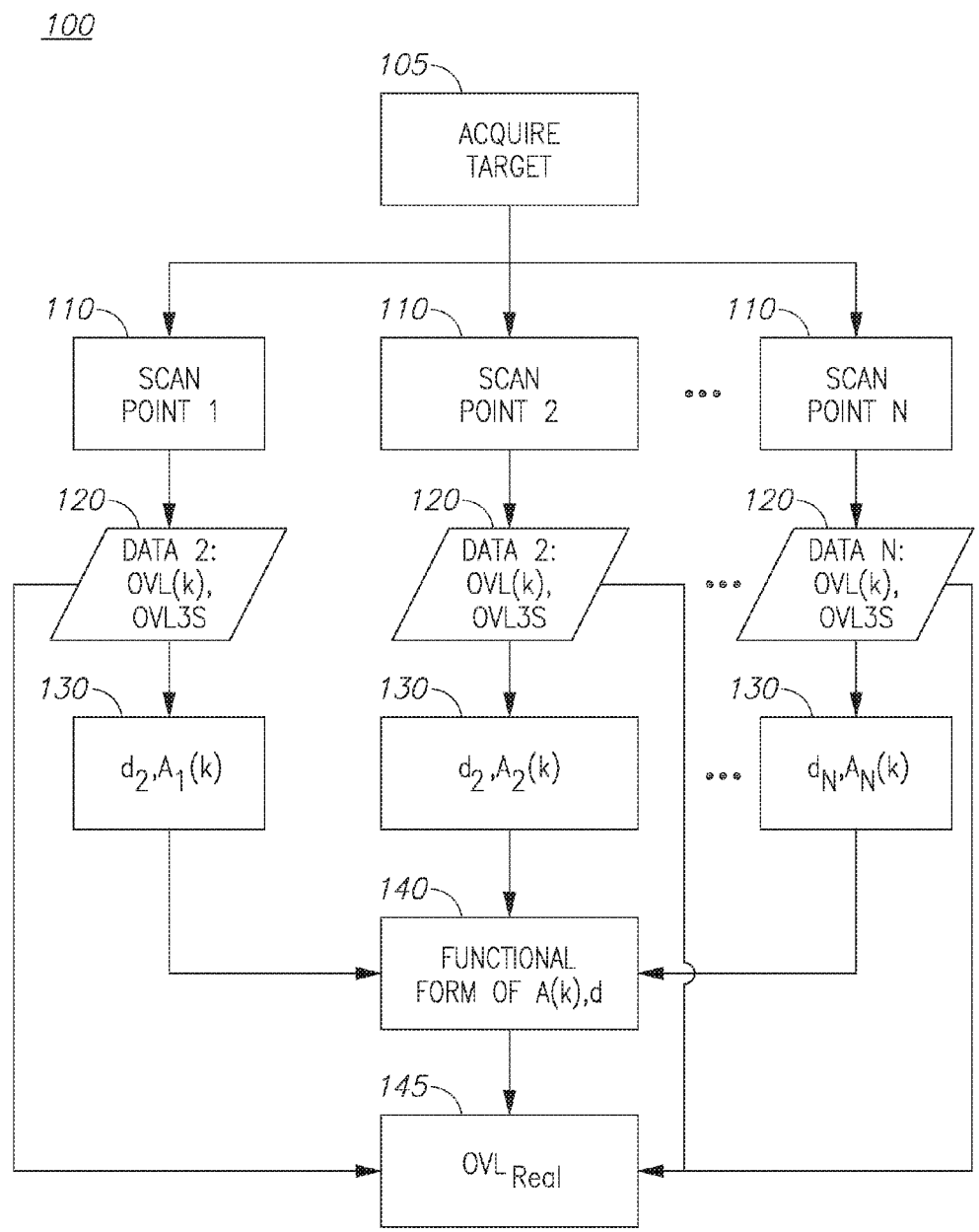
FIG. 2 is a high level schematic flowchart of a method of increasing the accuracy of overlay measurements, according to an exemplary embodiment of the present invention.

FIG. 2 is a high level schematic flowchart of a method 100 of increasing the accuracy of overlay measurements, according to some embodiments of the invention. Method 100 comprises acquiring a target 105, scanning a plurality of N points 110, collecting overlay data (OVL($\vec{k}$), OVL3S) 130 and deriving therefrom the functional form of $\vec{A}(\vec{k})$, $\vec{d}$ 140, from which a more accurate estimation of the overlay OVL (OVL$_{real}$) may be derived 145 by obtaining an estimate for the value $\vec{d}_{min}$ which minimizes the estimated OVL3S.

FIG. 3 is a high level schematic flowchart of method 100 of increasing the accuracy of overlay measurements, according to some embodiments of the invention. Method 100 may be partly or wholly carried out by at least one computer processor and/or by a metrology module in a metrology tool. Method 100 may comprise minimizing an estimated overlay variation measure such as OVL3S at misalignment vector values obtained from a derived functional form of the overlay linear response to non-periodic effects (stage 150), as described e.g., in FIG. 2.

Stages of method 100 may be at least partially performed by at least one processor, e.g., in a metrology module associated with a metrology tool. Certain embodiments comprise computer program products having computer readable storage media with computer readable program embodied therewith, which is configured to carry out, at least partially, stages of method 100.

Method 100 may comprise correcting misalignment errors (e.g., on the fly) using derived dependencies of OVL3S and of OVL($\vec{d}$) in a pre-production calibration stage (stage 160).

Method 100 may comprise selecting a target sample plan for movements between targets to minimize misalignment errors (stage 170), e.g., according to the derived functional form of the overlay response to non-periodic effects. For example, in case the main error in the overlay in the x-direction is the misalignment error in the x-direction, the target sample plan may be selected to move the alignment system in way that minimizes the alignment error in the x-direction. In another example, when operating with stage systems that have a larger error in the direction parallel to their principal axis of movement, an x-overlay target cell may be approached along the y-axis and vice versa.

In certain embodiments, method 100 further comprises scanning a target pattern using a spot of coherent light to yield a plurality of realizations of a light distribution in a collected pupil, wherein the spot covers a part of the target pattern and the scanning is carried out according to a scanning pattern; and generating a composite image of the collected pupil distribution by combining the plurality of realizations of the light distribution in the collected pupil, as disclosed in WIPO Patent Publication No. 2014004564, which is incorporated herein by reference in its entirety. Method 100 may further comprise selecting the scanning pattern to minimize misalignment errors according to the derived functional form of an overlay linear response to non-periodic effects.

Method 100 may comprise deriving a dependency of the OVL3S and OVL on the illumination spot size (stage 182), determining a length scale of the major contributor of the target noise (non-periodic effects) (stage 184) and selecting the spot size to be larger than the determined target noise scale (180), to minimize overlay measurement inaccuracy according to the derived dependency.

Certain embodiments comprise an angle-resolved reflectometer comprising: a coherent light source; an optical system arranged to scan a target pattern using a spot of coherent light from the light source to yield a plurality of realizations of a light distribution in a collected pupil, wherein the spot covers a part of the target pattern and the scanning is carried out according to a scanning pattern; and a processing unit arranged to generate a composite image of the collected pupil distribution by combining the plurality of realizations of the light distribution in the collected pupil, as disclosed in WIPO Patent Publication No. 2014004564, which is incorporated herein by reference in its entirety.

The processing unit may be further arranged to minimize an estimated overlay variation measure at misalignment vector values obtained from a derived functional form of an overlay linear response to non-periodic effects, and to select the scanning pattern to minimize misalignment errors according to the derived functional form of an overlay linear response to non-periodic effects.

In certain embodiments, the processing unit may be further configured to derive a dependency of the estimated overlay variation measure and of the overlay on an illumination spot size by determining a length scale of the major contributor of the non-periodic effects, select the spot size to be larger than the determined length scale, and minimize overlay measurement inaccuracy according to the derived dependency.

In certain embodiments, the processing unit may be further configured to calculate a sensitivity of a per-pixel overlay to spot positions by measuring the per-pixel overlay across several spot positions and defocus values and generating a per-pixel weight function to be a decreasing function of the sensitivity, and minimize the inaccuracy by selecting the weights of the pixels to be a decreasing function of their spot scan sensitivity.

Method 100 may comprise calculating the sensitivity of the per-pixel overlay to spot positions (stage 194) by measuring the per-pixel overlay across several spot positions and defocus values (stage 192) and generating a per-pixel weight function to be a decreasing function of the sensitivity (stage 196). Inaccuracy may then be minimized by selecting the weights of the pixels to be a decreasing function of their spot scan sensitivity (stage 190).

FIG. 4 is a high level schematic flowchart of a method 200 of measuring non-periodic effects in overlay measurements, according to some embodiments of the invention. Method 200 may further comprise indicating the measured non-periodic effects (also termed "target noise") (stage 290) and correcting for at least one component of the target noise (stage 295). Method 200 also comprises optimizing the measurement recipe for measurement quality by minimizing the sensitivity to the non-periodic effects (stage 280). Method 200 may thus be designed to utilize the strong dependency of the sensitivity of the optical metrology to non-periodic effects on the measurement recipe and target. Method 200 may be partly or wholly carried out by at least one computer processor and/or by a metrology module in a metrology tool. Certain embodiments comprise computer program products having computer readable storage media with computer readable program embodied therewith, which is configured to carry out, at least partially, stages of method 200. Method 200 may be carried out "on-the-fly" and/or 'in-train' with respect to the operation of the metrology tool.

Indicating the measured target noise 290 may be implemented as an accuracy flag which may be calculated during recipe and target optimization and serve as a metric for selecting production recipes, or as a quality metric during run time for monitoring the measurement quality.

Method 200 comprises quantifying the target noise using repeated SCOL measurements of the $N_c$ target cells, $N_s$ times ($N_s>1$) (stage 210). In each (standard) SCOL measurement the target is probed by focusing a laser beam on to one specific location and defocus ("spot location\defocus") in each of the $N_c$ cells of the target. Each measurement is performed with a different spot location and defocus, and for each measurement the resulting reflected light is collected and analyzed independently to obtain $N_c \times N_s$ pupil images. Method 200 further comprises calculating respective $N_s^{N_c}$ overlay measurements (stage 220) between all pairs of measurements and cells. In certain embodiments, method 200 may comprise measuring different cells with different numbers of scan points and\or defocus positions (stage 222) (i.e., $N_s$ may vary between cells) and calculating the overlays 220 respectively. Method 200 further comprises expressing the target noise as a statistical derivative of the calculated overlay measurements (stage 230), e.g., as the variance of the calculated ensemble of overlay measurements. Additionally, the average overlay as well as higher moments of the distribution may be calculated and used to quantify target and measurement parameters.

Method 200 may further comprise estimating the contribution of specific cells to the target noise (stage 240) by considering, for the specific cell i, all spot location measurements independently but calculating the overlays with respect to averaged measurement results from each of the spot locations of the other cells j≠i, i.e., with respect to cell averages of the other measurements. A set of overlay values is thus calculated for the measurements of cell i with respect to the averaged other cells. The target noise of cell i of the target is then characterized as a statistical derivative of this distribution (e.g., the variance) to characterize the contribution of cell i to the target noise.

In certain embodiments, e.g., when Tool Induced Shift (TIS) is a concern, two measurements in opposite orientations may be performed for each cell and spot location (instead of one measurement as described above), and the data from the two measurements may be combined and considered as a single spot location measurement for carrying out method 200. Hence method 200 may further comprise grouping several measurements for each cell and spot location (stage 250), e.g., in order to cancel out TIS.

In certain embodiments, method 200 and/or the calculating the overlay measurements 220 may further comprise applying advanced statistical methods, such a Jack-Knife or bootstrap statistics, to the overlay measurements, to improve the accuracy of the noise characterization (stage 232). Method 200 may be implemented on a site-by-site basis and be used to derive wafer statistics in a preparation or training stage, and/or method 200 may be performed on the fly in production to indicate unexpected process issues.

In certain embodiments, method 200 may comprise calculating the target noise by statistical evaluation of overlays measured using different sizes of spots (stage 260). The spot size may be increased (or varied) by varying the illumination and/or computationally by incoherent averaging of several spot positions (stage 262). For example, the overlay values of the multiple scan locations may be joined computationally in a way that decreases target noise. For example, the overlay values may be averaged, without or with a predetermined weighting function that takes into account the target noise correlation length, which, in turn, may be measured on the fly by mapping the overlay across the cell. The per-field definition of target noise may be derived from the difference in overlays which are measured for different spot sizes. For example, the difference between the largest spot size and the smallest spot size, the difference between a reference spot size and/or an actual spot size used during run-time may serve as respective estimates of the target noise, and used to funnel the choice of recipes\targets for production. Method 200 may comprise using a comparison to a specified spot size to indicate target noise during run-time (stage 264). Method 200 may further comprise modelling the functional dependency of the measured overlay on the size of the spot (stage 266) and extrapolating the values of the overlay to a large size of the spot to reduce the inaccuracy (stage 268). Modelling 266 may be carried out by measuring the overlay as a function of the spot size and modelling the measured dependency. Extrapolation 268 of the model to the limit of infinite spot size may then yield overlay values having zero inaccuracy. For example, a possible model may have the form: $OVL(spot_{size})=OVL_{true}+A/Spot_{size}$, from which $OVL_{true}$ may be extracted as an estimate of the accurate overlay.

It is noted that the estimation of the target noise may be used for either or both comparing the performance of a recipe and/or a target (e.g., to optimize the selection thereof) and reporting the target-noise (e.g., as an error bar) as a quantifier of the measurement quality and uncertainty on a field-by-field basis, as well as on a wafer average basis. The target noise measure may also be used to compare the quality of different processed layers in R&D, e.g., in order to better understand the possible process changes as a function of wafer position and time. A respective 'target noise' metric may also be used as a direct measurement and quantification of sought-for process imperfections like linewidth roughness, induced topography, line-edge roughness, and related geometric parameters and variations.

Method 200 may further comprise separating the effects of process noise from effects related to diffractions and scattering from target exterior (stage 270), by generating an ensemble of measurements as explained above by setting the spot positions to special locations within and outside the target (stage 272). For example, a two dimensional array of equidistance scan points (in a non-limiting example, having an inter-spot distance of 1 µm or 2 µm) may be used to calculate distribution moments for sub-ensembles which differ from each other by the amount of points that are more suspect to be affected by edge\vicinity effects (stage 274). The sub-ensembles may comprise different proportions of points in the vicinities of the target center, the target edges and the exterior of the targets. For example, for a rectangular target, some sub-ensembles may comprise points at the vicinity of the target center and other sub-ensembles may comprise points closer to the target edges. In a non-limiting example, for a 7×7 array of points, the target noise estimate may be performed by including the whole ensemble, or only the inner 5×5 array, or only the inner 3×3 array. A different example with a 3×3 array would be to use the ensemble of points excluding the scan points at corners of the array, and more generally generate any sub-ensemble of points that have in common the distance from the cell center. Sub ensembles may comprise any number of points at any arrangement, and may be selected according to their spatial relation to the target center and to the target edges. Method 200 may hence comprise generating an ensemble of measurements by setting illumination spot positions to special locations within and outside the target, calculating distribution moments for sub-ensembles of the measurement points having varying spatial relations to a target center and to target edges and separating effects of process noise from effects related to diffractions and scattering from target exterior by comparing the distribution moments of respective sub-ensembles.

Figure 5:
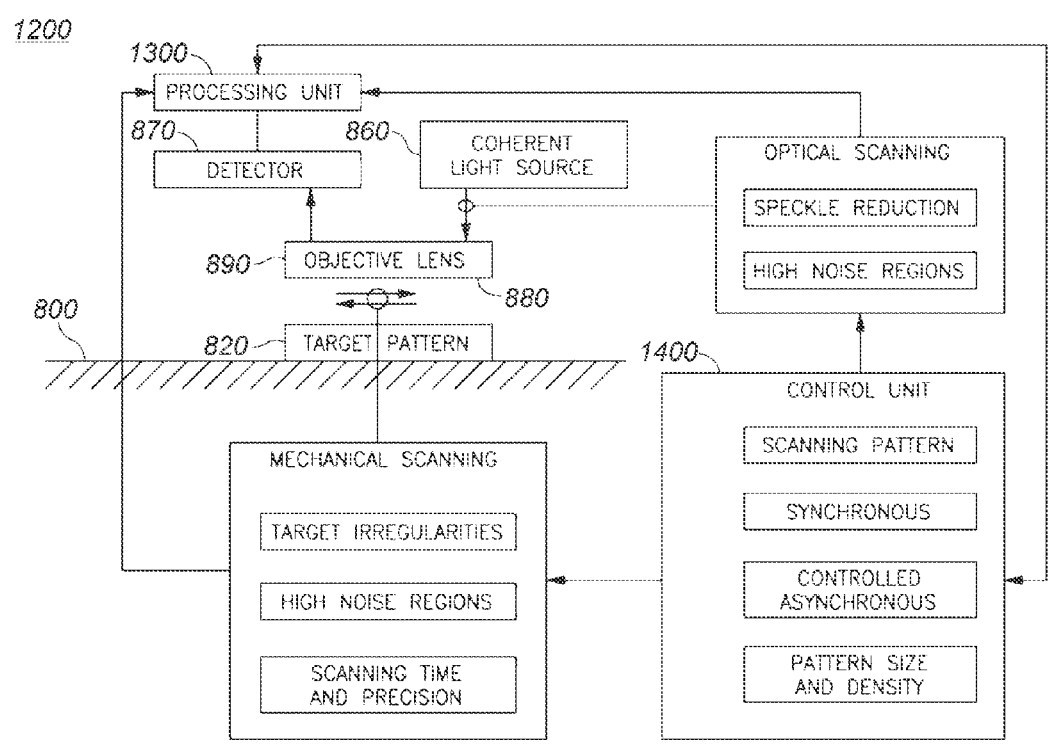
FIG. 5 is a high level schematic block diagram illustrating various parameters and controlled variables of a scanning angle-resolved reflectometer, according to some embodiments of the invention.

FIG. 5 is a high level schematic block diagram illustrating various parameters and controlled variables of scanning angle-resolved reflectometer 1200, according to some embodiments of the invention. FIG. 5 schematically illustrates coherent light source 860, detector 870, and objective lens 890. Reflectometer 1200 may comprise a processing unit 1300 arranged to process images from detector 870, generate measurements and integrated images from the processed images and further provide feedback to control unit 1400 regarding features of the images, as these are taken and processed. Collected pupil 880 may be the pupil of objective lens 890.

Certain embodiments may combine stages of methods 100, 200. Any of methods 100, 200 and their combinations may further comprise optimizing a measurement recipe for measurement quality by minimizing a sensitivity to the non-periodic effects according to the quantified target noise, indicating the quantified target noise and/or correcting overlay measurements for at least one component of the quantified target noise.

Certain embodiments comprise a model of angle resolved overlay scatterometry measurement which connects measured data and the statistics of the measured data to measurement accuracy as well as a measurement procedure that uses an angle resolved overlay metrology scatterometer to acquire data for the model. Certain embodiments comprise methods for calculating the response characteristics of the angle resolved scatterometer to target noise using the model and the data acquired through the measurement procedure. These features result in metrology modules and tools which make use of the statistical description of measured data to correct for target effects of non-periodicity in the target and thus enable an angle resolved overlay scatterometer to measure smaller targets with high accuracy by controlling the effects of non-periodicity.

Advantageously, certain embodiments significantly reduce the misalignment sensitivity of the overlay measurement by using signals that are defined in pupil plane, thereby improving the robustness of the misalignment correction. Moreover, certain embodiments release the tight specs on the accuracy and repeatability of the wafer-to-tool relative movements and enable performing overlay metrology using very small targets relieving the prior art's high sensitivity to misalignment errors. Furthermore, certain embodiments suppress the effect of target noise on the overlay measurements.

Advantageously, certain embodiments allow judicious choice of spot scan size (in case of spot scanning applications) and of recipe\target combination with superior quality.

Certain embodiments allow detection of target noise and generally non-periodic effects in production. Moreover, target noise and non-periodic effects such as line-edge roughness, line-width roughness, non-periodic induced topography, may be estimated quantitatively and be used to indicate and improve processes in run-time.

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their used in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. An angle-resolved reflectometer comprising:
    a coherent light source;
    an optical system including at least one of:
        a detector configured to measure light from a collected pupil of the optical system, a coherent light source, a control unit, an optical scanning unit, or a mechanical scanning unit,
        wherein the optical system is configured to scan a target pattern according to a scanning pattern using a spot of coherent light from the coherent light source to yield a plurality of scans associated with light distribution in a collected pupil, wherein the spot covers a part of the target pattern; and
    one or more processing units communicatively coupled to the optical system, wherein the one or more processing units are configured to execute a set of program instructions stored in memory, wherein the program instructions are configured to cause the one or more processing units to:
        receive a plurality of scans associated with a light distribution in the collected pupil of the optical system from the detector;
        derive an overlay linear response to at least one non-periodic effect based on at least one of an overlay value, a misalignment vector, or an overlay linear response vector; and
        estimate a corrected overlay value based on the derived overlay linear response to at least one non-periodic effect.

2. The angle-resolved reflectometer of claim 1, wherein the program instructions are configured to cause the one or more processing units to determine a length scale of at least one non-periodic effect of the target pattern.

3. The angle-resolved reflectometer of claim 2, wherein the program instructions are configured to select a size of the spot of coherent light to be larger than the determined length scale.

4. The angle-resolved reflectometer of claim 3, wherein the program instructions are configured to generate an estimated overlay variation function dependent on the size of the spot of coherent light.

5. The angle-resolved reflectometer of claim 1, wherein the program instructions are configured to cause the one or more processing units to:
    measure a per-pixel overlay value for at least one position of a spot of coherent light and at least one defocus value;
    calculate a spot scan sensitivity of the per-pixel overlay to the at least one position of the spot of coherent light; and
    generate a per-pixel weight function based on the spot scan sensitivity.

6. An apparatus comprising:
    a memory element configured to store a set of computer-readable instructions;
    one or more processors communicatively coupled to an optical system, the optical system including at least one of a detector, a coherent light source, a control unit, an optical scanning unit, or a mechanical scanning unit, wherein the detector is configured to measure light from a collected pupil of the optical system,
    wherein the one or more processors are configured to execute the set of computer-readable instructions to:
        receive a plurality of scans associated with a light distribution in the collected pupil of the optical system from the detector;
        derive an overlay linear response to at least one non-periodic effect based on at least one of an overlay value, a misalignment vector, or an overlay linear response vector; and
        estimate a corrected overlay value based on the derived overlay linear response to at least one non-periodic effect.

7. The angle-resolved reflectometer of claim 6, wherein the program instructions are configured to cause the one or more processing units to determine a length scale of at least one non-periodic effect of the target pattern.

8. The angle-resolved reflectometer of claim 7, wherein the program instructions are configured to select a size of the spot of coherent light to be larger than the determined length scale.

9. The angle-resolved reflectometer of claim 8, wherein the program instructions are configured to generate an estimated overlay variation function dependent on the size of the spot of coherent light.

10. The angle-resolved reflectometer of claim 6, wherein the program instructions are configured to cause the one or more processing units to:
    measure a per-pixel overlay value for at least one position of a spot of coherent light and at least one defocus value;
    calculate a spot scan sensitivity of the per-pixel overlay to the at least one position of the spot of coherent light; and
    generate a per-pixel weight function based on the spot scan sensitivity.

11. A metrology method, comprising:
    acquiring a plurality of scans associated with light distribution in a collected pupil of an optical system with a detector of the optical system;

deriving an overlay linear response to at least one non-periodic effect based on at least one of an overlay value, a misalignment vector, or an overlay linear response vector; and estimating a corrected overlay value based on the derived overlay linear response to at least one non-periodic effect.

12. The method of claim 11, further comprising:
determining a length scale of at least one non-periodic effect of the target pattern.

13. The method of claim 12, further comprising:
selecting a size of the spot of coherent light to be larger than the determined length scale.

14. The method of claim 13, further comprising:
generating an estimated overlay variation function based on the size of the spot of coherent light.

15. The method of claim 14, further comprising:
correcting one or more misalignment errors based on the estimated overlay variation function during pre-production calibration.

16. The method of claim 14, further comprising:
optimizing a measurement recipe for measurement quality by minimizing a spot scan sensitivity to the at least one non-periodic effect according to the estimated overlay variation function.

17. The method of claim 14, further comprising:
identifying the at least one non-periodic effect with the estimated overlay variation function.

18. The method of claim 14, further comprising:
correcting at least one overlay measurement with the estimated overlay variation function.

19. The method of claim 11, further comprising:
measuring a per-pixel overlay value for at least one position of a spot of coherent light and at least one defocus value;

calculating a spot scan sensitivity of the per-pixel overlay to the at least one position of the spot of coherent light; and generating a per-pixel weight function based on the spot scan sensitivity.

20. The method of claim 11, further comprising:
scanning an $N_c$ number of target cells, wherein each cell is scanned an $N_s$ number of times with a spot of coherent light from a coherent light source, wherein $N_s$ is greater than 1;

obtaining an $N_c \times N_s$ number of pupil images;

calculating an $N_s^{Nc}$ number of overlay measurements; and quantifying a target noise of the $N_c$ number of target cells as a statistical derivative of the $N_s^{Nc}$ number of overlay measurements.

* * * * *